(12) United States Patent
Wang et al.

(10) Patent No.: US 9,786,654 B1
(45) Date of Patent: Oct. 10, 2017

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Jhih-Ming Wang, Yunlin County (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/298,248

(22) Filed: Oct. 20, 2016

(30) Foreign Application Priority Data

Sep. 29, 2016 (CN) .......................... 2016 1 0861342

(51) Int. Cl.
*H01L 23/62* (2006.01)
*H01L 27/02* (2006.01)
*H01L 29/06* (2006.01)

(52) U.S. Cl.
CPC ...... *H01L 27/0266* (2013.01); *H01L 29/0623* (2013.01); *H01L 29/0649* (2013.01)

(58) Field of Classification Search
None
See application file for complete search history.

(56) References Cited

U.S. PATENT DOCUMENTS

| 9,224,850 | B2 | 12/2015 | Goto et al. |
| 2012/0074497 | A1* | 3/2012 | Gao ....................... H01L 27/027 257/355 |
| 2012/0175673 | A1* | 7/2012 | Lee ..................... H01L 27/0277 257/140 |
| 2012/0326239 | A1 | 12/2012 | Sasaki et al. |
| 2017/0084603 | A1* | 3/2017 | Huang ................ H01L 27/0886 |

OTHER PUBLICATIONS

Li, Title of Invention: High-Voltage Semiconductor Device With Finger-Shaped Insulation Structure, U.S. Appl. No. 14/970,549, filed Dec. 16, 2015.
Wang, Title of Invention: Electrostatic Discharge Protection Semiconductor Device, U.S. Appl. No. 15/273,682, filed Sep. 22, 2016.

* cited by examiner

*Primary Examiner* — Calvin Choi
(74) *Attorney, Agent, or Firm* — Winston Hsu

(57) ABSTRACT

An ESD protection semiconductor device includes a substrate, a first isolation structure disposed in the substrate, a gate disposed on the substrate and overlapping a portion of the first isolation structure, a source region formed in the substrate at a first side of the gate, and a drain region formed in the substrate at a second side of the gate opposite to the first side. The substrate and the drain region include a first conductivity type, the source region includes a second conductivity type, and the first conductivity and the second conductivity type are complementary to each other.

18 Claims, 7 Drawing Sheets

_US 9,786,654 B1_

ELECTROSTATIC DISCHARGE PROTECTION SEMICONDUCTOR DEVICE

BACKGROUND OF THE INVENTION

1. Field of the Invention

The present invention relates to an electrostatic discharge (hereinafter abbreviated as ESD) protection semiconductor device, more particularly, to a dual direction ESD protection semiconductor device.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. As a countermeasure against to the ESD issue, there have been proposed ESD protection circuits/devices. During a normal IC operation, the ESD protection device is turned off. However when an ESD event occurs, the ESD protection device must be quickly triggered, so that the ESD current is immediately bypassed from the inner circuit.

Typically, when a voltage across the ESD protection device/circuit is higher than trigger voltage (Vt1), snapback breakdown occurs and the voltage is clamped. In other words, when snapback breakdown occurs, the voltage across the circuit drops down to the holding voltage. Therefore, trigger voltage and holding voltage are main considerations when designing the ESD protection device/circuit. Furthermore, it is found that breakdown voltage (BV) is also in need of consideration. For example, when the operation signal is lower than a breakdown voltage range of the ESD protection device/circuit, its body diode is turned on, and error is found in IC function. Specifically, this issue is more severe when the operation signal is a negative value.

Accordingly, a dual direction ESD protection device is still in need.

SUMMARY OF THE INVENTION

According to the claimed invention, an ESD protection semiconductor device is provided. The ESD protection semiconductor device includes a substrate, a first isolation structure disposed in the substrate, a gate disposed on the substrate, a source region formed in the substrate at a first side of the gate, and a drain region formed in the substrate at a second side of the gate opposite to the first side. The gate overlaps a portion of the first isolation structure. The substrate and the drain region include a first conductivity type, and the source region includes a second conductivity type. The second conductivity type is complementary to the first conductivity type.

According to the ESD protection semiconductor device provided by the present invention, a tunnel transistor is formed by the gate, the source region and the drain region while the source region and the drain region are complementary to each other. Furthermore, the source region and the drain region respectively serve as a cathode and an anode of the ESD protection semiconductor device. During the operation, when a positive ESD pulse occurs, the ESD currents flow from the drain region (the anode) to the source (the cathode). And when a negative ESD pulse occurs, the ESD currents flow from the source region (the cathode) to the drain region (the anode). Thus a dual direction ESD protection semiconductor device is obtained. More important, the duel direction ESD protection semiconductor device is constructed without increasing device area.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
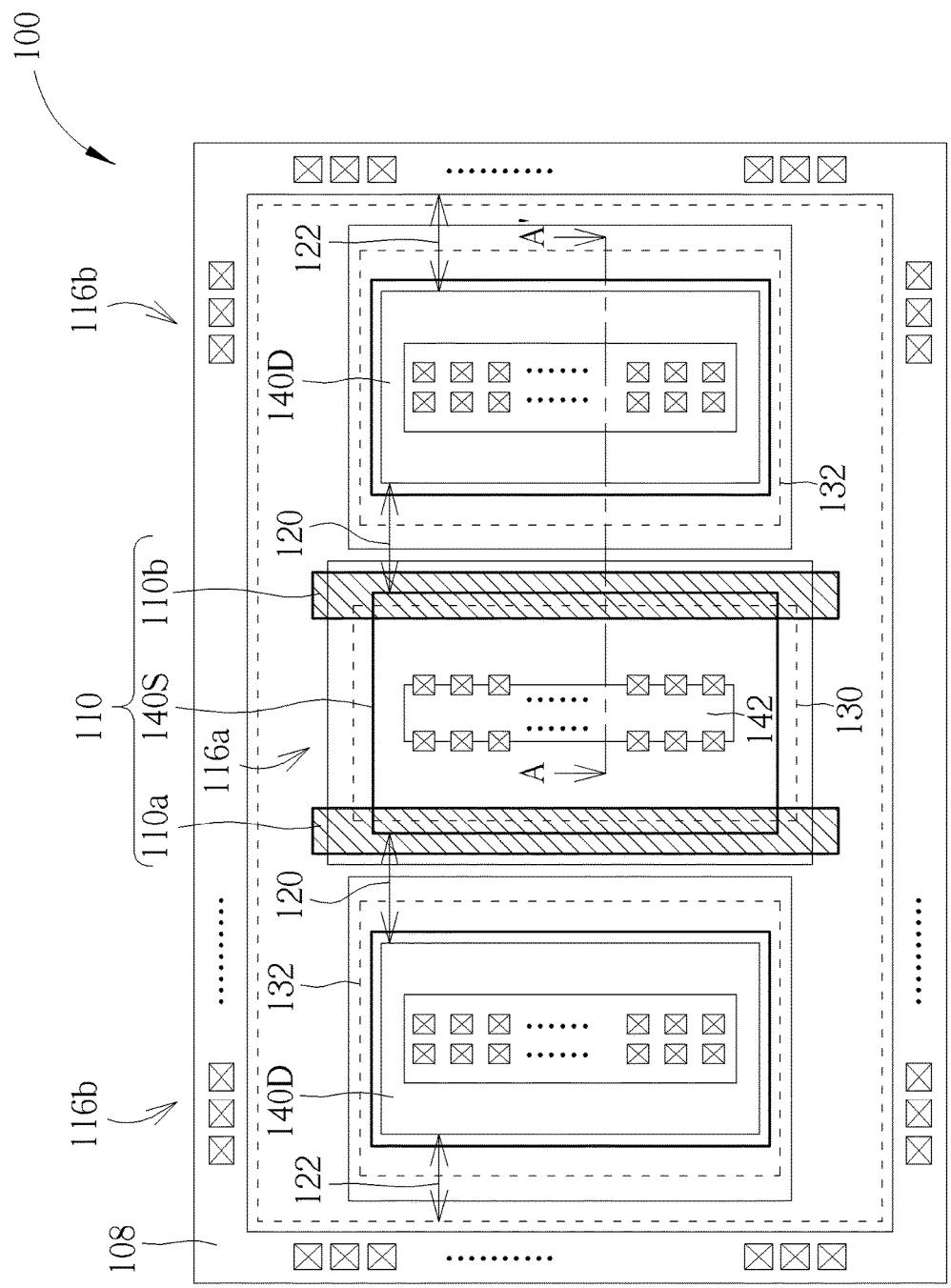
FIG. 1 is a schematic drawing illustrating a layout structure of an ESD protection semiconductor device provided by a first preferred embodiment of the present invention.
Figure 2:
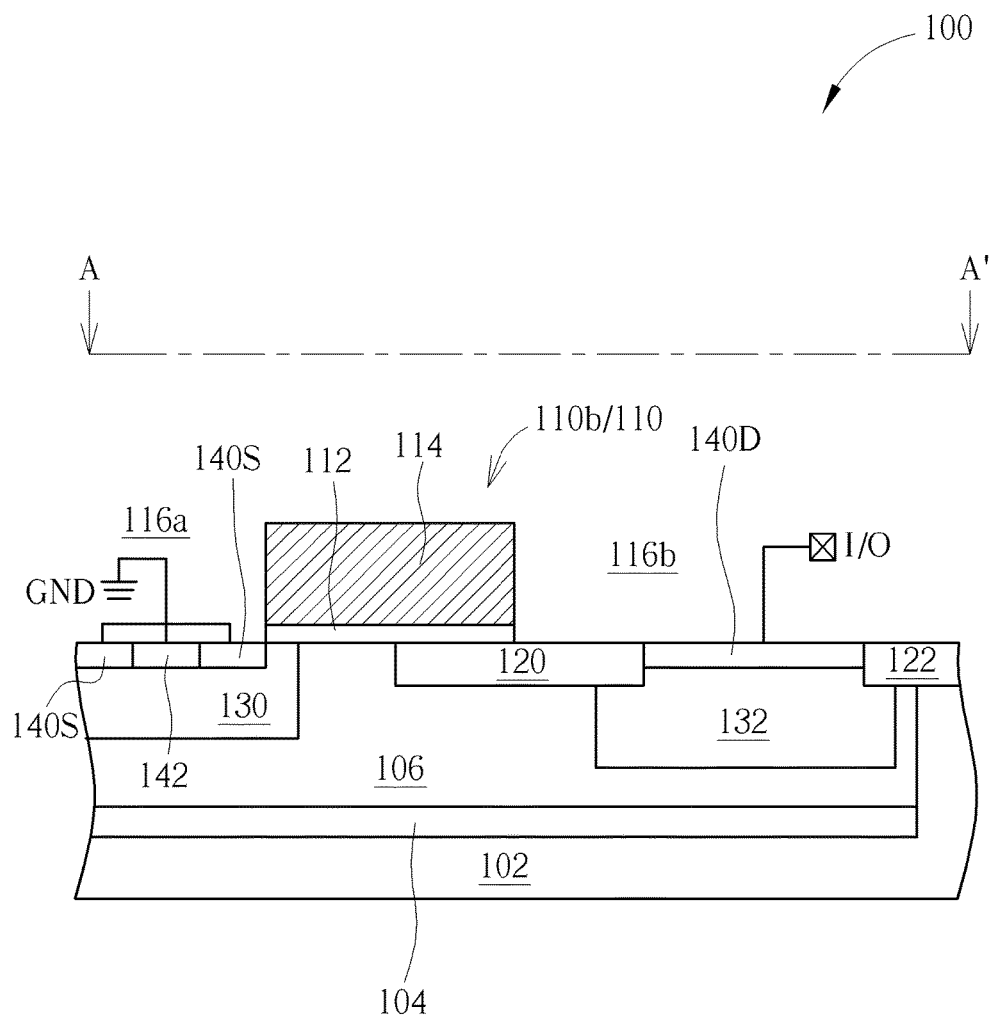
FIG. 2 is a schematic drawing illustrating the ESD protection semiconductor device provided by the first preferred embodiment and a cross-sectional view taken along a Line A-A' of FIG. 1.

Please refer to FIGS. 1 and 2, wherein FIG. 1 is a schematic drawing illustrating a layout structure of an ESD protection semiconductor device provided by a first preferred embodiment of the present invention, and FIG. 2 is a schematic drawing illustrating the ESD protection semiconductor device provided by the first preferred embodiment and a cross-sectional view taken along a Line A-A' of FIG. 1. As shown in FIGS. 1 and 2, the preferred embodiment provides an ESD protection semiconductor device 100. The ESD protection semiconductor device 100 includes a substrate 102 (shown in FIG. 2), and the substrate 102 include a first conductivity type. A buried layer 104 (shown in FIG. 2) is formed in the substrate 102, and the buried layer 104 includes a second conductivity type. The second conductivity type is complementary to the first conductivity type. In the preferred embodiment, the first conductivity type is a p type and the second conductivity type is an n type. However those skilled in the art would easily realize that the first conductivity type can be an n type and the second conductivity type can be a p type in other embodiments of the present invention. A deep well 106 is formed in the substrate 102, and the deep well 106 includes the second conductivity type. Furthermore, the buried layer 104 is formed under the deep well 106. As shown in FIG. 2, the buried layer 104 directly contacts a bottom of the deep well 106. Additionally, the ESD protection semiconductor device 100 further includes a guard ring 108 formed in the substrate 102, and the guard ring 108 surrounds the whole ESD protection semiconductor device 100 as shown in FIG. 1. The guard ring 106 includes the first conductivity type.

Please still refer to FIG. 1 and FIG. 2. The ESD protection semiconductor device 100 further includes a gate 110 disposed on the substrate 102. Particularly, the gate 110 is disposed on the deep well 106. In the preferred embodiment, the gate 110 further includes a gate line 110a and a gate line 110b, but not limited to this. The gate line 110a and the gate line 110b respectively include a gate dielectric layer 112 and a gate conductive layer 114 (shown in FIG. 2). Since materials for forming the gate conductive layer 114 and the gate dielectric layer 112 are well-known to those skilled in the art, those details are omitted in the interest of brevity. The ESD protection semiconductor device 100 further includes a first isolation structure 120 and a second isolation structure 122 disposed in the substrate 102. In the preferred embodiment, the first isolation structure 120 and the second isolation structure 122 can include shallow trench isolation (hereinafter abbreviated as STI), but not limited to this. As shown in FIG. 1 and FIG. 2, the gate 110 overlaps a portion of the first isolation structure 120. In detail, the gate line 110a and the gate line 110b respectively overlap a portion of the first isolation structure 120.

Please still refer to FIG. 1 and FIG. 2. The ESD protection semiconductor device 100 include a first well 130 and a second well 132 formed in the substrate 102, and more particularly, in the deep well 106. As shown in FIG. 1 and FIG. 2, the first well 130 is formed in between the gate line 110a and the gate line 110b, and the second well 132 is formed in between the first isolation structure 120 and the second isolation structure 122. Additionally, the first well 130 and the second well 132 are spaced apart from the buried layer 104 by the deep well 106 as shown in FIG. 2. The first well 130 includes the first conductivity type while the second well 132 includes the second conductivity type. In other words, two wells are formed at the two opposite sides of the gate line 110a and the two opposite sides of the gate line 110b, and the two wells are complementary to each other. The ESD protection semiconductor device 100 further includes a source region 140S and a drain region 140D. The source region 140S is formed in the substrate 102 at a first sides 116a of the gate line 110a/gate line 110b, particularly in the first well 130. The drain region 140D is formed in the substrate 102 at a second side 116b of the gate line 110a/gate line 110b, particularly in the second well 132. As shown in FIG. 2, the first side 116a and the second side 116b are two opposite sides of each gate line 110a/110b. As mentioned above, the first well 130 and the second well 132 are formed in the deep well 106, therefore the source region 140S and the drain region 140D are also formed in the deep well 106. As shown in FIG. 1, the first side 116a is the side between the gate line 110a and the gate line 110b, and the source region 140S and the first well 130 are formed in between the gate line 110a and the gate line 110b. Therefore, the source region 140S serves as a common source of the ESD protection semiconductor device 100. The drain region 140D and the second well 132 are formed in between the first isolation structure 120 and the second isolation structure 122. More important, the source region 140S includes the second conductivity type while the drain region 140D includes the first conductivity type. In other words, the source region 140S and the drain region 140D formed at the two opposite sides of each gate line 110a/110b are complementary to each other. Furthermore, the ESD protection semiconductor device 100 includes a doped region 142 formed in the source region 140S, and also formed in the first well 130. The doped region 142 includes the first conductivity type, and a concentration of the doped region 142 and a concentration of the drain region 140D are the same. As shown in FIG. 1 and FIG. 2, the drain region 140D is electrically connected to a pad such as an input/output pad I/O by wiring, and the source region 140S and the doped region 142 are electrically connected to a ground pad GND by wiring.

Figure 3:
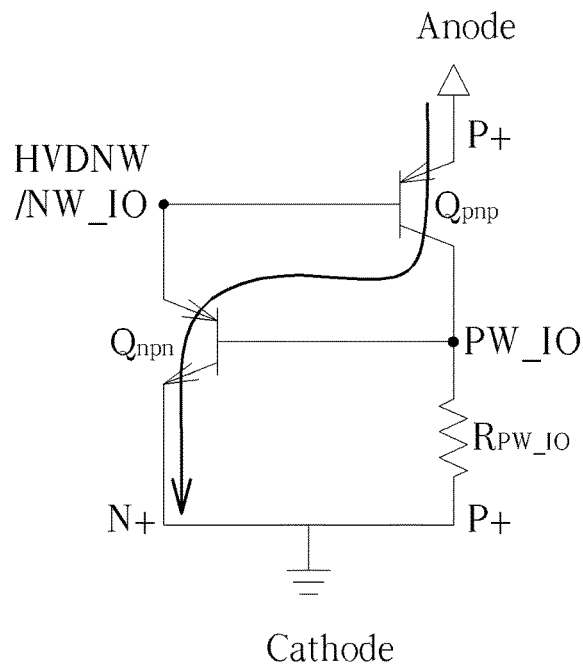
FIGS. 3 and 4 are circuit diagrams of an ESD protection circuit provided by the present invention.
Figure 4:
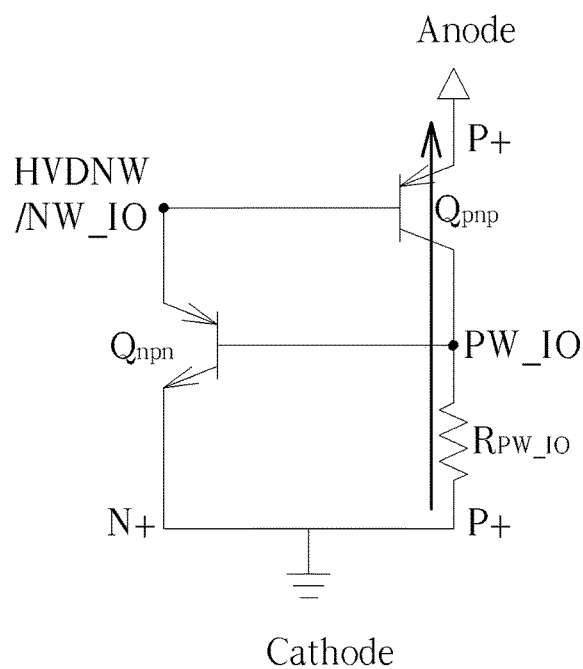

Please refer to FIGS. 2-4, wherein FIGS. 3 and 4 are circuit diagrams of an ESD protection circuit provided by the present invention. According to the ESD protection semiconductor device 100 provided by the preferred embodiment, the gate 110 (both of the gate line 110a and the gate line 110b), and the source region 140S and the drain region 140D, which are complementary to each other, construct a tunnel transistor. The source region 140S and the doped region 142 that electrically connected to the ground pad GND serves as a cathode of the ESD protection circuit while the drain region 140D that electrically connected to the input/output pad I/O serves an anode of the ESD protection circuit. As shown in FIG. 3, when a positive pulse occurs, the drain region 140D including the first conductivity type, the second well 132 and the deep well 106 including the second conductivity type, the first well 130 including the first conductivity type, and the source region 140S including the second conductivity type form a pnpn silicon controlled rectifier (hereinafter abbreviated as SCR). Consequently, the ESD currents flow from the drain region 140D (the anode) to the source region 140S (the cathode) through the second well 132, the deep well 106 and the first well 130, and then to the ground pad GND. More important, a breakdown voltage of the SCR can be higher than 38V. As shown in FIG. 4, when a negative pulse occurs, the doped region 142 and the first well 130 including the first conductivity type, the deep well 106 and the second well 132 including the second conductivity type, and the drain region 140D including the first conductivity type form a pnp bipolar junction transistor (hereinafter abbreviated as BJT). Consequently, the ESD currents flow from the doped region 142 (the cathode) to the drain region 140D (the anode) through the first well 130, the deep well 106 and the second well 132. More important, a breakdown voltage of the pnp-BJT can be lowered to −11V.

According to the ESD protection semiconductor device 100 provided by the preferred embodiment, the tunnel transistor is formed by the gate 110a/110b, the source region 140S and the drain region 140D while the source region 140S and the drain region 140D are complementary to each other. Furthermore, the source region 140S and the drain region 140D respectively serve as the cathode and the anode of the ESD semiconductor protection circuit. During the operation, when a positive ESD pulse occurs, the ESD currents flow from the drain region (the anode) to the source (the cathode). And when a negative ESD pulse occurs, the ESD currents flow from the source region (the cathode) to the drain region (the anode). Thus a dual direction ESD protection semiconductor device is obtained. More important, the duel direction ESD protection semiconductor device 100 is constructed without increasing device area.

Figure 5:
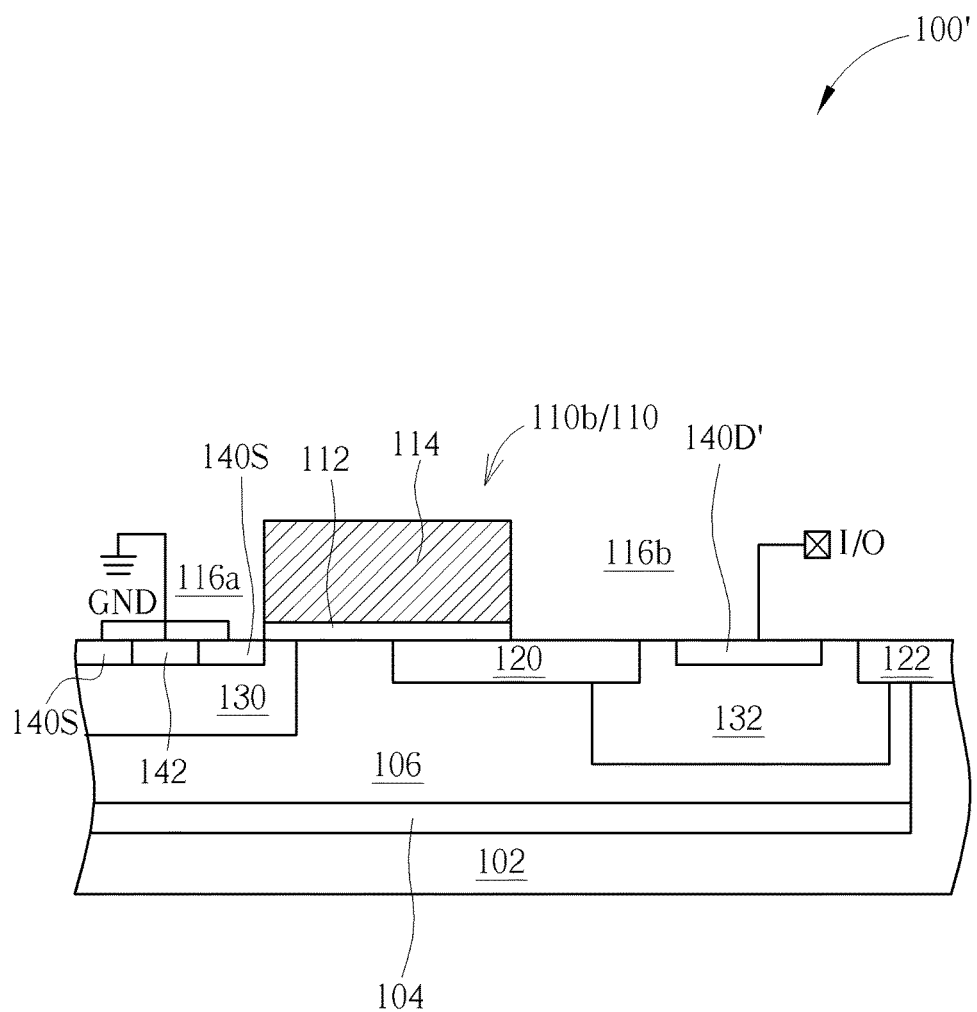
FIG. 5, which is a schematic drawing illustrating a modification to the preferred embodiment.

Please refer to FIG. 5, which is a schematic drawing illustrating a modification to the preferred embodiment. It should be noted that elements the same in the present modification and the first preferred embodiment are designated by the same numerals and include the same material choice and electrical relationships, therefore those details are omitted for simplicity. The modification provides an ESD protection semiconductor device 100', the difference between the modification and the aforementioned preferred embodiment is: The ESD protection semiconductor device 100' includes a drain region 140D', and the drain region 140D' includes the first conductivity type. It is noteworthy that the drain region 140D' is spaced apart from both of the first isolation structure 120 and the second isolation structure 122 by the second well 132, as shown in FIG. 5.

According to the modification, the duel direction ESD protection semiconductor device 100' is constructed without increasing device area. More important, since the drain region 140D' is spaced apart from the first isolation structure 120 and the second isolation structure 122 by the second well 132, electric fields generated during operation and often crowded between the isolation structure and the drain region of the ESD protection device are pushed away from the first isolation structure 120. Consequently, soft-leakage issue that caused by this electric field crowding effect is prevented. Briefly speaking, robustness of the ESD protection semiconductor device 100' is improved.

Figure 6:
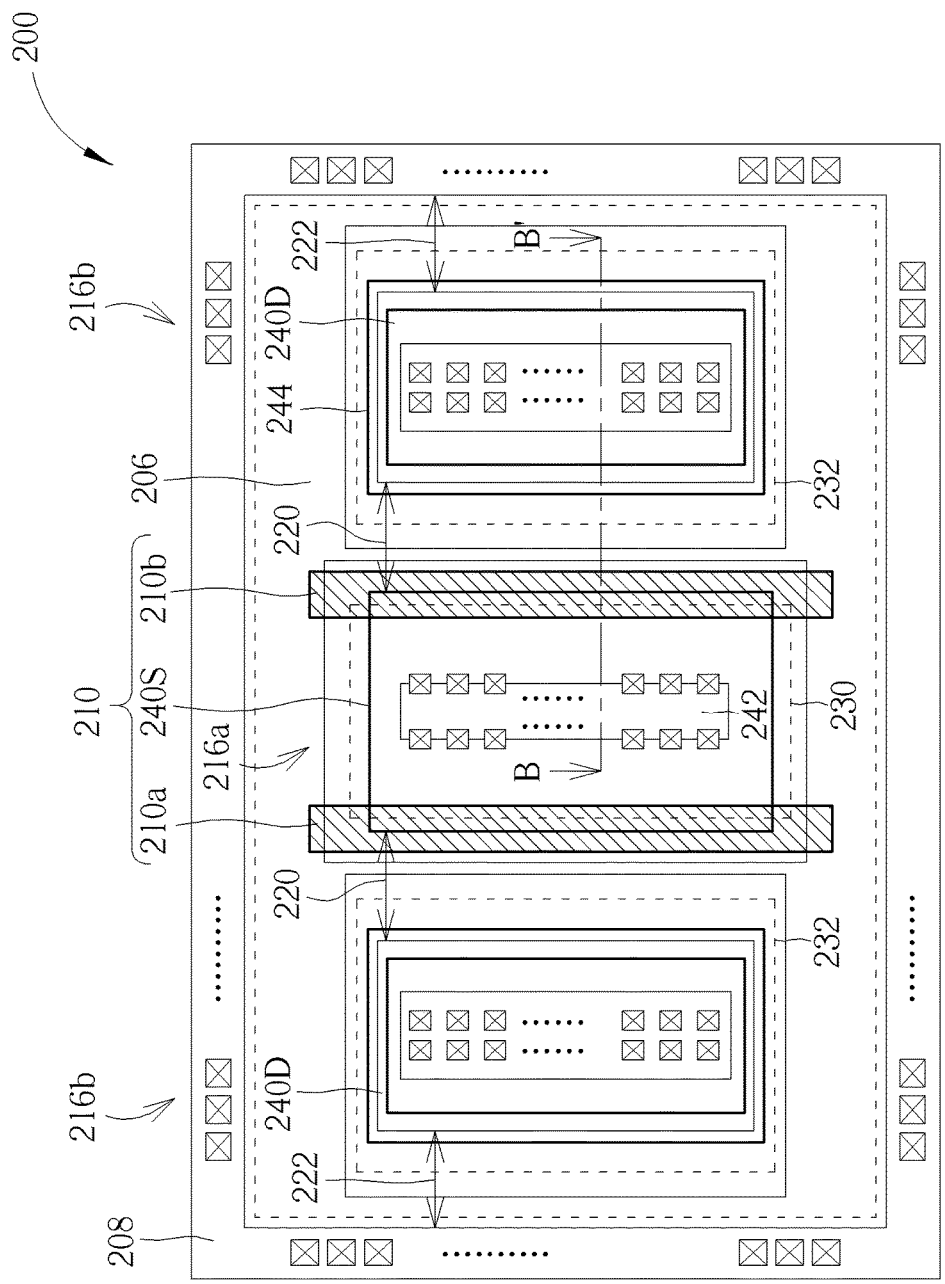
FIG. 6 is a schematic drawing illustrating a layout structure of an ESD protection semiconductor device provided by a second preferred embodiment of the present invention.
Figure 7:
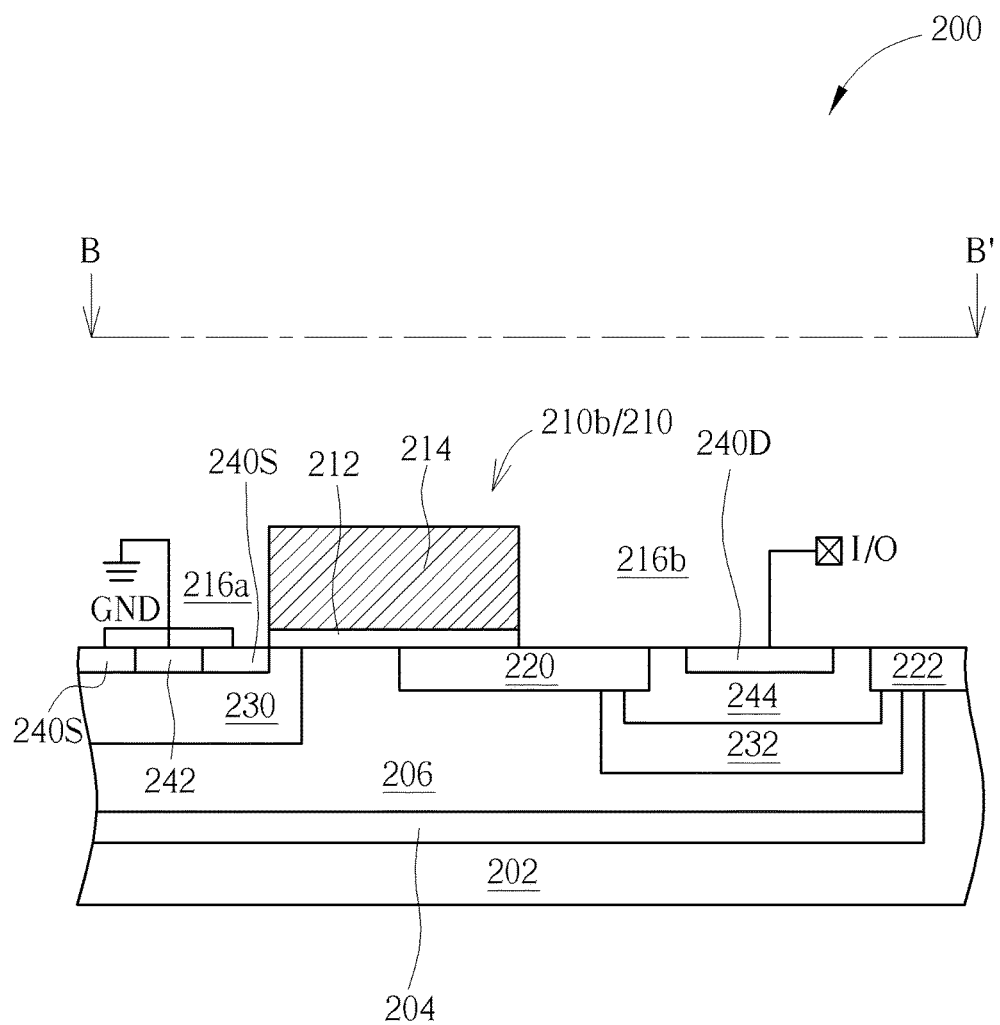
FIG. 7 is a schematic drawing illustrating the ESD protection semiconductor device provided by the second preferred embodiment and a cross-sectional view taken along a Line B-B' of FIG. 1.

Please refer to FIG. 6 and FIG. 7, wherein FIG. 6 is a schematic drawing illustrating a layout structure of an ESD protection semiconductor device provided by a second preferred embodiment of the present invention, and FIG. 7 is a schematic drawing illustrating the ESD protection semiconductor device provided by the second preferred embodiment and a cross-sectional view taken along a Line B-B' of FIG. 6. As shown in FIG. 6 and FIG. 7, the preferred embodiment provides an ESD protection semiconductor device 200. The ESD protection semiconductor device 200 includes a substrate 202 (shown in FIG. 7), and the substrate 202 include a first conductivity type. A buried layer 204 (shown in FIG. 7) is formed in the substrate 202, and the buried layer 204 includes a second conductivity type. The second conductivity type is complementary to the first conductivity type. In the preferred embodiment, the first conductivity type is a p type and the second conductivity type is an n type. However those skilled in the art would easily realize that the first conductivity type can be an n type and the second conductivity type can be a p type in other embodiments of the present invention. A deep well 206 is formed in the substrate 202, and the deep well 206 includes the second conductivity type. Furthermore, the buried layer 204 is formed under the deep well 206. As shown in FIG. 7, the buried layer 204 directly contacts a bottom of the deep well 206. Additionally, the ESD protection semiconductor device 200 further includes a guard ring 208 formed in the substrate 202, and the guard ring 208 surrounds the whole ESD protection semiconductor device 200 as shown in FIG. 6. The guard ring 208 includes the first conductivity type.

Please still refer to FIG. 6 and FIG. 7. The ESD protection semiconductor device 200 further includes a gate 210 disposed on the substrate 202. Particularly, the gate 210 is disposed on the deep well 206. In the preferred embodiment, the gate 210 further includes a gate line 210a and a gate line 210b, but not limited to this. The gate line 210a and the gate line 210b respectively include a gate dielectric layer 212 and a gate conductive layer 214 (shown in FIG. 7). Since materials for forming the gate conductive layer 214 and the gate dielectric layer 212 are well-known to those skilled in the art, those details are omitted in the interest of brevity. The ESD protection semiconductor device 200 further includes a first isolation structure 220 and a second isolation structure 222 disposed in the substrate 202. In the preferred embodiment, the first isolation structure 220 and the second isolation structure 222 can include STI, but not limited to this. As shown in FIG. 6 and FIG. 7, the gate 210 overlaps a portion of the first isolation structure 220. In detail, the gate line 210a and the gate line 210b respectively overlap a portion of the first isolation structure 220.

Please still refer to FIG. 6 and FIG. 7. The ESD protection semiconductor device 200 includes a first well 230 and a second well 232 formed in the substrate 202, and more particularly, in the deep well 206. As shown in FIG. 6 and FIG. 7, the first well 230 is formed in between the gate line 210a and the gate line 210b, and the second well 232 is formed in between the first isolation structure 220 and the second isolation structure 222. Additionally, the first well 230 and the second well 232 are spaced apart from the buried layer 204 by the deep well 206. The first well 230 includes the first conductivity type while the second well 232 includes the second conductivity type. In other words, two wells are formed at the two opposite sides of the gate line 210a and the two opposite sides of the gate line 210b, and the two wells are complementary to each other. The ESD protection semiconductor device 200 further includes a source region 240S and a drain region 240D. The source region 240S is formed in the substrate 202 at a first sides 216a of the gate line 210a/gate line 210b, particularly in the first well 230. The drain region 240D is formed in the substrate 202 at a second side 216b of the gate line 210a/gate line 210b, particularly in the second well 232. As shown in FIG. 7, the first side 216a and the second side 216b are two opposite sides of each gate line 210a/210b. As mentioned above, the first well 230 and the second well 232 are formed in the deep well 206, therefore the source region 240S and the drain region 240D are formed in the deep well 206. As shown in FIG. 6, the first side 216a is the side between the gate line 210a and the gate line 210b, and the source region 240S and the first well 230 are formed in between the gate line 210a and the gate line 210b. Therefore, the source region 240S serves as a common source of the ESD protection semiconductor device 200. The drain region 240D and the second well 232 are formed in between the first isolation structure 220 and the second isolation structure 222. More important, the source region 240S includes the second conductivity type while the drain region 240D includes the first conductivity type. In other words, the source region 240S and the drain region 240D formed at the two opposite sides of each gate line 210a/210b are complementary to each other. Furthermore, the ESD protection semiconductor device 200 includes a doped region 242 formed in the source region 240S, and also formed in the first well 230. The doped region 242 includes the first conductivity type, and a concentration of the doped region 242 and a concentration of the drain region 240D are the same. It is noteworthy that the ESD protection semiconductor device 200 provided by the preferred embodiment further includes a doped region 244 formed in the second well 232, and the drain region 240D is formed in the doped region 244. More important, the drain region 240D is spaced apart from the second well 232 by the doped region 244. And the drain region 240D is spaced apart from both of the first isolation structure 230 and the second isolation structure 232 by the doped region 244, as shown in FIG. 6 and FIG. 7. The doped region 244 includes the first conductivity type. In other words, the drain region 240D and the doped region 244 include the same conductivity type. However, a concentration of the doped region 244 is smaller than a concentration of the drain region 240D. As shown in FIG. 6 and FIG. 7, the drain region 240D is electrically connected to a pad such as an input/output pad I/O by wiring, and the source region 240S and the doped region 242 are electrically connected to a ground pad GND by wiring.

Please refer to FIGS. 3-4 and 7. According to the ESD protection semiconductor device 200 provided by the preferred embodiment, the gate 210 (both of the gate line 210a and the gate line 210b), and the source region 240S and the drain region 240D, which are complementary to each other, construct a tunnel transistor. The source region 240S and the doped region 242 that electrically connected to the ground pad GND serves as a cathode of the ESD protection circuit while the drain region 240D that electrically connected to the input/output pad I/O serves an anode of the ESD protection circuit. As shown in FIG. 3 and FIG. 7, when a positive pulse occurs, the drain region 240D and the doped region 244 including the first conductivity type, the second well 232 and the deep well 206 including the second conductivity type, the first well 230 including the first conductivity type, and the source region 240S including the second conductivity type form a pnpn-SCR. Consequently, the ESD currents flow from the drain region 240D (the anode) to the source region 240S (the cathode) through the doped region 244, the second well 232, the deep well 206 and the first well 230, and then to the ground pad GND. As shown in FIG. 4 and FIG. 7, when a negative pulse occurs, the doped region 242 and the first well 230 including the first conductivity type, the deep well 206 and the second well 232 including the second conductivity type, and the doped region 244 and the drain region 240D including the first conductivity type form a pnp-BJT. Consequently, the ESD currents flow from the doped region 242 (the cathode) to the drain region 240D (the anode) through the first well 230, the deep well 206, the second well 232, and the doped region 244.

More important, by adjusting the doped region 244, which includes the concentration lower than the drain region 240D, the breakdown voltage between the drain region 240D and the second well 232 is adjusted. In detail, since the concentration of the doped region 244 is lower than that of the drain region 240D, a concentration gradient is obtained. Therefore, the breakdown voltage between the drain region 240D and the second well 232 is increased.

According to the ESD protection semiconductor device 200 provided by the preferred embodiment, the tunnel transistor is formed by the gate 210a/210b, the source region 240S and the drain region 240D while the source region 240S and the drain region 240D are complementary to each other. Furthermore, the source region 240S and the drain region 240D respectively serve as the cathode and the anode of the ESD semiconductor protection circuit. During the operation, when a positive ESD pulse occurs, the ESD currents flow from the drain region (the anode) to the source (the cathode). And when a negative ESD pulse occurs, the ESD currents flow from the source region (the cathode) to the drain region (the anode). Thus a dual direction ESD protection semiconductor device is obtained. Furthermore, the breakdown voltage of the ESD protection semiconductor device 200 is adjustable by forming the doped region 244. More important, the duel direction ESD protection semiconductor device 200 is constructed without increasing device area.

Figure 8:
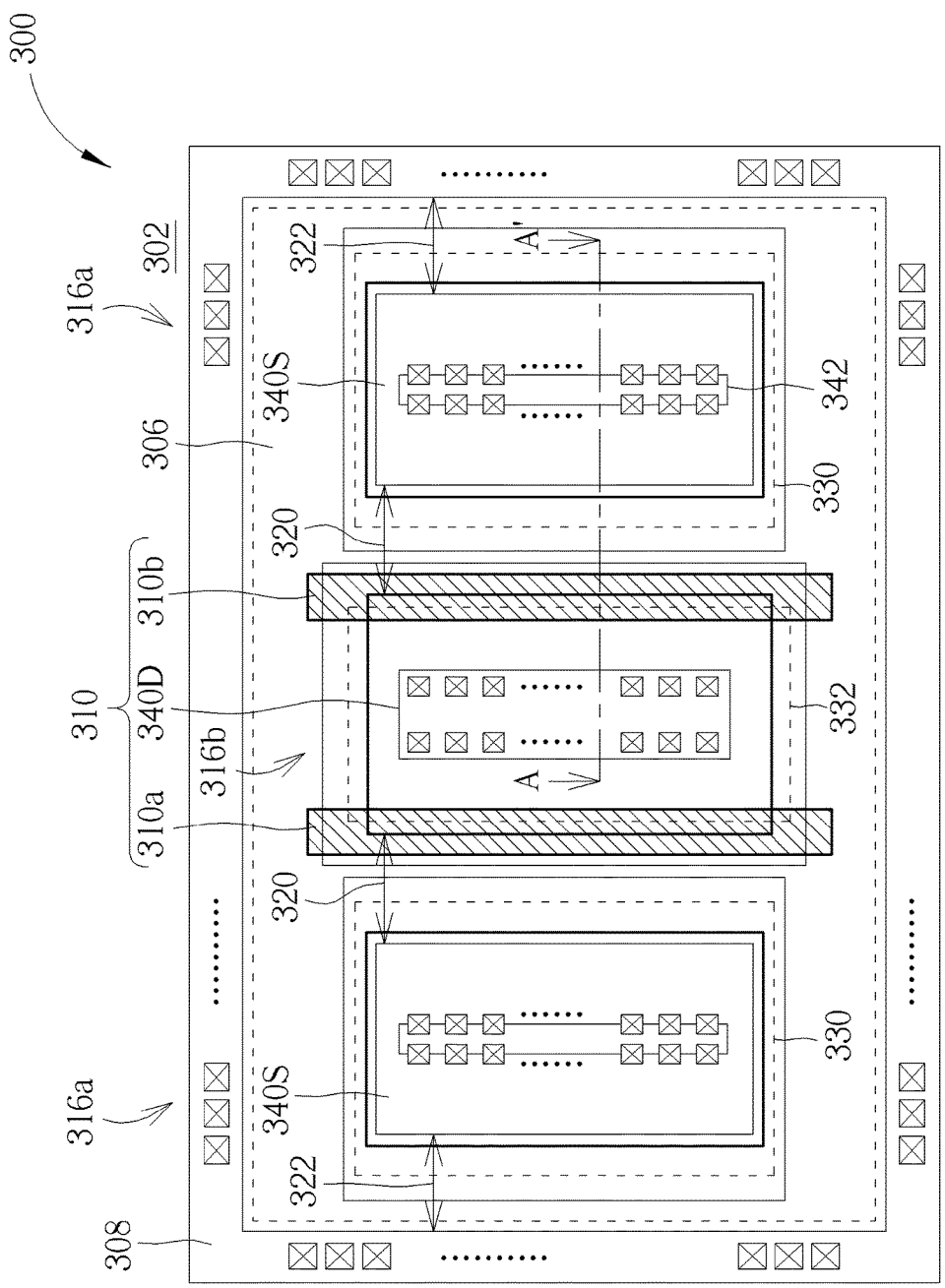
FIG. 8 is a schematic drawing illustrating a layout structure of an ESD protection semiconductor device provided by a third preferred embodiment of the present invention.

Please refer to FIG. 8, which is a schematic drawing illustrating a layout structure of an ESD protection semiconductor device provided by a third preferred embodiment of the present invention. As shown in FIG. 8, the preferred embodiment provides an ESD protection semiconductor device 300. The ESD protection semiconductor device 300 includes a substrate 302, and the substrate 302 includes a first conductivity type. A buried layer (not shown) is formed in the substrate 302, and the buried layer includes a second conductivity type. The second conductivity type is complementary to the first conductivity type. In the preferred embodiment, the first conductivity type is a p type and the second conductivity type is an n type. However those skilled in the art would easily realize that the first conductivity type can be an n type and the second conductivity type can be a p type in other embodiments of the present invention. A deep well 306 is formed in the substrate 302, and the deep well 306 includes the second conductivity type. Furthermore, the buried layer is formed under the deep well 306. As mentioned above, the buried layer directly contacts a bottom of the deep well 306. Additionally, the ESD protection semiconductor device 300 further includes a guard ring 308 formed in the substrate 302, and the guard ring 308 surrounds the whole ESD protection semiconductor device 300 as shown in FIG. 8. The guard ring 308 includes the first conductivity type.

Please still refer to FIG. 8. The ESD protection semiconductor device 300 further includes a gate 310 disposed on the substrate 302. Particularly, the gate 310 is disposed on the deep well 306. In the preferred embodiment, the gate 310 further includes a gate line 310a and a gate line 310b, but not limited to this. The gate line 310a and the gate line 310b respectively include a gate dielectric layer and a gate conductive layer. Since materials for forming the gate conductive layer and the gate dielectric layer are well-known to those skilled in the art, those details are omitted in the interest of brevity. The ESD protection semiconductor device 300 further includes a first isolation structure 320 and a second isolation structure 322 disposed in the substrate 302. In the preferred embodiment, the first isolation structure 320 and the second isolation structure 322 can include STI, but not limited to this. As shown in FIG. 8, the gate 310 overlaps a portion of the first isolation structure 320. In detail, the gate line 310a and the gate line 310b respectively overlap a portion of the first isolation structure 320.

Please still refer to FIG. 8. The ESD protection semiconductor device 300 include a first well 330 and a second well 332 formed in the substrate 302, and more particularly, in the deep well 306. As shown in FIG. 8, the second well 332 is formed in between the gate line 310a and the gate line 310b, and the first well 330 is formed in between the first isolation structure 320 and the second isolation structure 322. Additionally, the first well 330 and the second well 332 are spaced apart from the buried layer by the deep well 306. The first well 330 includes the first conductivity type while the second well 332 includes the second conductivity type. In other words, two wells are formed at the two opposite sides of the gate line 310a and the two opposite sides of the gate line 310b, and the two wells are complementary to each other. The ESD protection semiconductor device 300 further includes a source region 340S and a drain region 340D. The source region 340S is formed in the substrate 302 at a first sides 316a of the gate line 310a/gate line 310b, particularly in the first well 330. The drain region 340D is formed in the substrate 302 at a second side 316b of the gate line 310a/gate line 310b, particularly in the second well 332. As shown in FIG. 8, the first side 316a and the second side 316b are two opposite sides of each gate line 310a/310b. As mentioned above, the first well 330 and the second well 332 are formed in the deep well 306, therefore the source region 340S and the drain region 340D are formed in the deep well 306. As shown in FIG. 8, the second side 316b is the side between the gate line 310a and the gate line 310b in accordance with the preferred embodiment, and the drain region 340D and the second well 332 are formed in between the gate line 310a and the gate line 310b. Therefore, the drain region 340D serves as a common drain of the ESD protection semiconductor device 300. The source region 340S and the first well 330 are formed in between the first isolation structure 320 and the second isolation structure 322. More important, the source region 340S includes the second conductivity type while the drain region 340D includes the first conductivity type. In other words, the source region 340S and the drain region 340D formed at the two opposite sides of each gate line 310a/310b are complementary to each other. Furthermore, the ESD protection semiconductor device 300 includes a doped region 342 formed in the source region 340S, and also formed in the first well 330. The doped region 342 includes the first conductivity type, and a concentration of the doped region 342 and a concentration of the drain region 340D are the same. The drain region 340D is electrically connected to a pad such as an input/output pad I/O by wiring, and the source region 340S and the doped region 342 are electrically connected to a ground pad GND by wiring.

According to the ESD protection semiconductor device 300 provided by the preferred embodiment, the tunnel transistor is formed by the gate 310a/310b, the source region 340S and the drain region 340D while the source region 340S and the drain region 340D are complementary to each other. Furthermore, the source region 340S and the drain region 340D respectively serve as the cathode and the anode of the ESD semiconductor protection circuit. During the operation, when a positive ESD pulse occurs, the ESD currents flow from the drain region (the anode) to the source (the cathode). And when a negative ESD pulse occurs, the ESD currents flow from the source region (the cathode) to the drain region (the anode). Thus a dual direction ESD protection semiconductor device is obtained. More important, the duel direction ESD protection semiconductor device 300 is constructed without increasing device area.

According to the ESD protection semiconductor devices provided by the present invention, a tunnel transistor is formed by the gate, the source region and the drain region while the source region and the drain region are complementary to each other. Furthermore, the source region and the drain region respectively serve as the cathode and the anode of the ESD protection semiconductor device. During the operation, when a positive ESD pulse occurs, the ESD currents flow from the drain region (the anode) to the source (the cathode). And when a negative ESD pulse occurs, the ESD currents flow from the source region (the cathode) to the drain region (the anode). Thus a dual direction ESD protection semiconductor device is obtained. More important, the duel direction ESD protection semiconductor device is constructed without increasing device area. Furthermore, the present invention provides not only the ESD protection semiconductor device including common source but also the ESD protection semiconductor device including common drain. In other words, the duel direction ESD protection semiconductor device provided by the present invention obtains improved product flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An electrostatic discharge (ESD) protection semiconductor device comprising:
  a substrate comprising a first conductivity type;
  a first isolation structure disposed in the substrate;
  a gate disposed on the substrate, and the gate overlapping a portion of the first isolation structure;
  a source region formed in the substrate at a first side of the gate, the source region comprising a second conductivity type, and the second conductivity type being complementary to the first conductivity type; and a drain region formed in the substrate at a second side of the gate opposite to the first side, and the drain region comprising the first conductivity type.

2. The ESD protection semiconductor device according to claim 1, further comprising a first doped region formed in the source region, and the first doped region comprising the first conductivity type.

3. The ESD protection semiconductor device according to claim 2, wherein a concentration of the drain region and a concentration of the first doped region are the same.

4. The ESD protection semiconductor device according to claim 2, further comprising a first well formed in the substrate, and the first well comprising the first conductivity type.

5. The ESD protection semiconductor device according to claim 4, wherein the source region and the first doped region are formed in the first well.

6. The ESD protection semiconductor device according to claim 1, further comprising a second well formed in the substrate, and the second well comprising the second conductivity type.

7. The ESD protection semiconductor device according to claim 6, wherein the drain region is formed in the second well and spaced apart from the first isolation structure by the second well.

8. The ESD protection semiconductor device according to claim 6, further comprising a second isolation structure formed in the substrate, the drain region being formed in between the first isolation structure and the second isolation structure, and spaced apart from both of the first isolation structure and the second isolation structure by the second well.

9. The ESD protection semiconductor device according to claim 6, further comprising a second doped region formed in the second well, and the second doped region comprising the first conductivity type.

10. The ESD protection semiconductor device according to claim 9, wherein a concentration of the second doped region is smaller than a concentration of the drain region.

11. The ESD protection semiconductor device according to claim 9, wherein the drain region is spaced apart from the second well by the second doped region.

12. The ESD protection semiconductor device according to claim 11, further comprising a second isolation structure formed in the substrate, the drain region is formed in between the first isolation structure and the second isolation structure, and the drain region is spaced apart from both of the first isolation structure and the second isolation structure by the second doped region.

13. The ESD protection semiconductor device according to claim 1, further comprising a deep well formed in the substrate, and the deep well comprising the second conductivity type.

14. The ESD protection semiconductor device according to claim 13, wherein the source region and the drain region are formed in the deep well.

15. The ESD protection semiconductor device according to claim 13, further comprising a buried layer formed in the substrate under the deep well, and the buried layer comprising the second conductivity type.

16. The ESD protection semiconductor device according to claim 1, wherein the gate comprises a first gate line and a second gate line.

17. The ESD protection semiconductor device according to claim 16, wherein the source region is formed in between the first gate line and the second gate line.

18. The ESD protection semiconductor device according to claim 16, wherein the drain region is formed in between the first gate line and the second gate line.

\* \* \* \* \*